(12) United States Patent  
Mahler et al.

(10) Patent No.: US 6,391,112 B1
(45) Date of Patent: May 21, 2002

(54) HEAT-EXCHANGING WORKHOLDER FOR A VACUUM UNIT

(75) Inventors: Peter Mahler, Hainburg; Michael Scherer, Rodenbach, both of (DE)

(73) Assignee: Unaxis Trading AG, Trubbach (CH)

( * ) Notice: Subject to any disclaimer, the term of this patent is extended or adjusted under 35 U.S.C. 154(b) by 0 days.

(21) Appl. No.: 09/502,737

(22) Filed: Feb. 11, 2000

(30) Foreign Application Priority Data

Feb. 12, 1999 (EP) .............................................. 99810131

(51) Int. Cl.⁷ ............................................... B05C 13/02
(52) U.S. Cl. ............................ 118/500; 118/50; 118/59; 118/69; 118/725; 269/21
(58) Field of Search ................................. 118/50, 58, 59, 118/69, 500, 725, 728; 269/21, 25, 291, 292, 294, 296; 204/298.15

(56) References Cited

U.S. PATENT DOCUMENTS 5,842,690 A    12/1998  Lee et al. ...................... 269/21
5,919,330 A *  7/1999   Pall et al. .................... 156/305

FOREIGN PATENT DOCUMENTS

DE          4303398         8/1994

* cited by examiner

*Primary Examiner*—Laura Edwards
(74) *Attorney, Agent, or Firm*—Notaro & Michalos P.C.

(57) ABSTRACT

A workpiece holding device for a vacuum unit has coolable or heatable transfer plates (2) displaceable independently of one another in a baseplate (1) and each comprising a heat transfer surface (3) which is surrounded by an O-ring (4), is connected to a pipe (5) and, with a workpiece (15) which is pressed against the O-ring (4) by a holder (16), encloses a gap (20). The holder (16) can be locked to the baseplate (1). After lowering of the holder (16) into a closed position and load-free locking to the baseplate (1), the heat transfer plates (2) are pneumatically raised until in each case a stop (23, 22) becomes effective between said heat transfer plates and the holder (16) and determines the width of the gap (20). The gap (20) is then filled via the pipe (5) with a heat transfer medium, e.g. helium. After processing of the workpiece (15), the heat transfer plates (2) are lowered and the holder (16) is released again in a loadfree manner.

13 Claims, 1 Drawing Sheet

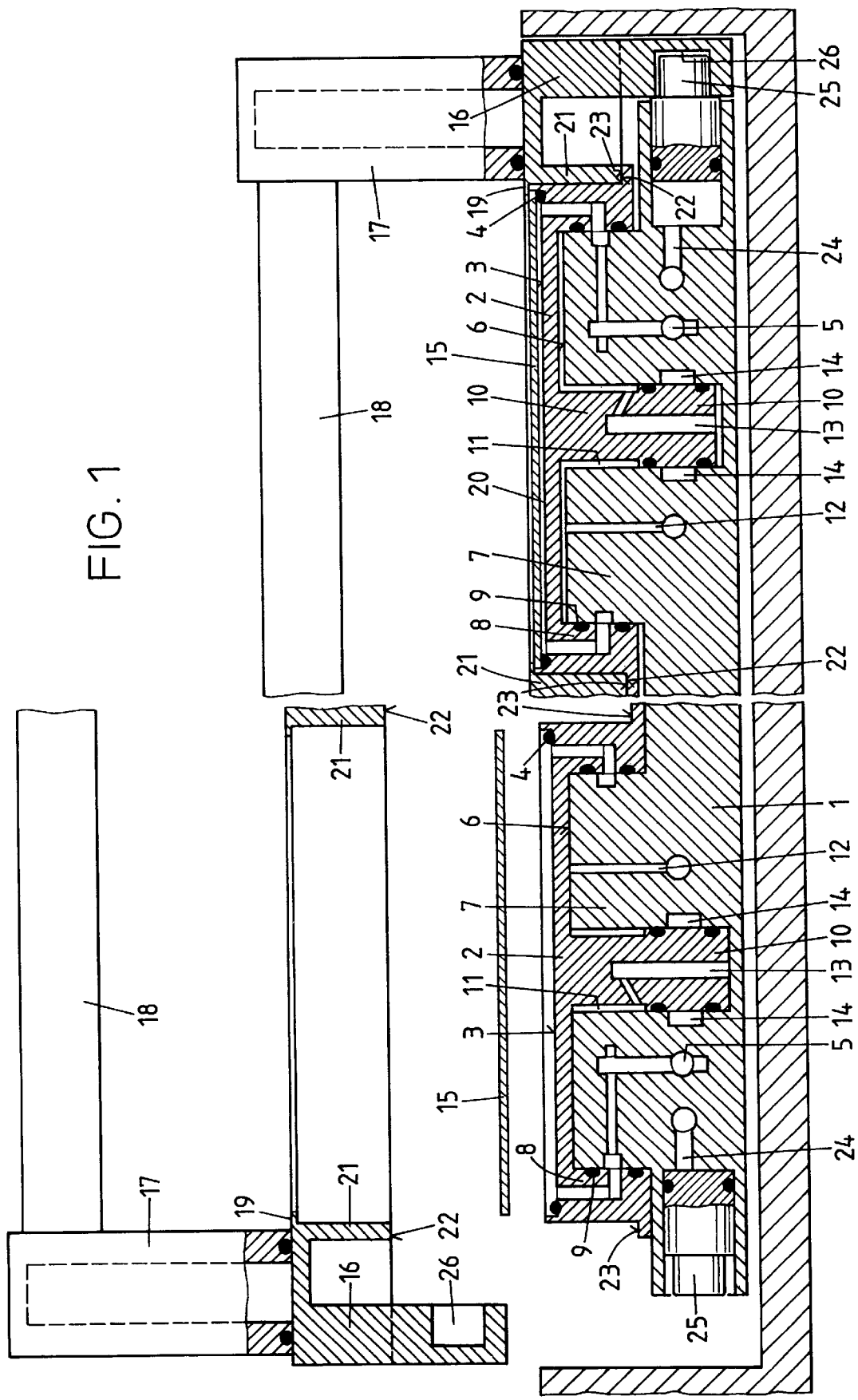

HEAT-EXCHANGING WORKHOLDER FOR A VACUUM UNIT

The device relates to a workpiece holding device for a vacuum unit, as used for fixing plate-like workpieces, such as wafers or CDs, which are to be coated in the unit, for example by-vapour deposition, and a process for its operation.

A workpiece holding device of the generic type is known (TOPAZ-RFD from Balzers Aktiengesellschaft) comprising a plurality of heat transfer plates on which workpieces intended to be coated are placed in such a way that, with the respective heat transfer plate, they enclose a gap into which a fluid heat transfer medium, in particular a gas having good thermal conductivity, is passed so that, during the coating process, the workpieces are cooled by cooling the heat transfer plates, in each case via the gas phase. The transfer plates are integrated in the baseplate, and the holder which serves for fixing the workpieces is screwed thereto.

This solution in which the adjustment of the individual layers of the workpieces, in particular of the cooling gap formed in each case between the heat transfer plate and the lower surface of the workpiece, is effected with slight deformation of the holder has various disadvantages. The screwing must be carried out manually, which is relatively complicated and time-consuming and can give rise to operating errors. For example, incorrect torques may be chosen when tightening the screws, which may lead to incorrect adjustment of the cooling gap and consequently to nonuniform cooling of the workpieces, resulting in nonuniform coating. In the case of the adjustment of the layers of the workpieces, mutual influence cannot be ruled out. Moreover, screwing can very easily result in particles, which settle on the workpieces and impair the product quality.

Accordingly, it is the object of the invention to provide a workpiece holding device of the generic type which very substantially operates automatically and with high operational safety, and a process for its operation which ensures locking and release of the holder and in which the formation of troublesome particles is virtually completely avoided. These objects are achieved by the features in the characterizing clause of claims 1 and 10, respectively. Further advantages are the very exact automatic adjustment of the gap, which takes place in each case completely independently with a plurality of workpieces, and the avoidance of the formation of troublesome particles, which leads to an improvement in the coating quality and a reduction of spoilage particularly during operation of the workpiece holding device according to the invention by the process according to the invention, there is virtually no danger of formation of troublesome particles since locking and release occur in a load-free manner and therefore virtually without friction.

Below, the invention is explained in more detail with reference to a Figure which represents only one embodiment.

FIG. 1 shows a cross-section through a workpiece holding device according to the invention, in the open position on the left and in the closed position on the right.

A baseplate 1 carries a number of, for example, round heat transfer plates 2 in two rows arranged side by side. The upper side of each heat transfer plate 2 forms a flat heat transfer surface 3 which is bordered by an all-round O-ring 4 as a sealing element and a web. Slightly inside the O-ring 4, the heat transfer surface 3 is interrupted by an essentially closed all-round gap which is connected to a pipe 5 via a plurality of holes.

In the open position, the heat transfer plate 2 rests with its lower surface in each case on a support surface 6, the top of a cylindrical support block 7 of the baseplate 1.

An all-round downward-projecting skirt 8 of the heat transfer plated 2 carries an all-round seal 9 which cooperates with the lateral surface of the support block 7. A cylindrical extension 10 of the heat transfer plate 2, which extension is arranged centrally in the lower side, is displaceably mounted in a hole 11 in the baseplate 1, which is arranged in the centre of the support block 7. In addition, a pressure medium pipe 12 leads through the support block 7 to the support surface 6. The upper part of the hole 11 surrounds the extension 10 at a distance. The free intermediate space, together with connecting channel 13 led axially to the end face thereof through the extension 10, serves a for pressure equilibration. Moreover, channels 14 which are led directly to the extension 10 pass through the baseplate 1.

The workpiece 15 to be coated it may be, for example, a round plastics disc, a CD blank which is provided with an aluminium layer—rests on the O-ring 4 during processing. It is fixed in this position by means of a holder 16 which can be moved back and forth perpendicular to the heat transfer surfaces 3 by means of a vacuum lifter 17 having a handle 18 between an open position which is shown on the left and in which it has been raised from the baseplate 1 and a closed position which is shown on the right and in which it has been lowered onto the baseplate 1. The holder 16 has, opposite each heat transfer plate 2, an all-round projection 19 which forms a fixing stop pointing towards the heat transfer surface 3 and, in the closed position, presses against the edge region of the workpiece 15. The latter is pressed against the O-ring 4 which is thus elastically compressed and seals a gap which is formed between the lower surface of the workpiece 15 and the heat transfer surface 3 and whose width is not greater than 1 mm, in particular not greater than 0.3 mm, but is preferably about 0.1 mm or less.

The holder 16 has webs 21, an all-round edge web and a continuous central web, which form stop surfaces 22 pointing towards the heat transfer plates 2 and parallel to the heat transfer surfaces 3. In the closed position, they abut opposite stop surfaces 23 on the heat transfer plates 2, together with which they form stops which determine the positions of the heat transfer plates 2 relative to the holder For locking the holder 16 in the closed position, the baseplate 1 has a locking device with a plurality of bolts 25 which can be pushed forwards and back preferably pneumatically, by means of pressure lines 24, and which engage corresponding recesses 26 in the holder 16.

Before evacuation of the vacuum chamber, the workpieces 15 are placed manually on the O-rings 4. In each case the gap 20 is then evacuated via the pipe 5 and is checked for leaks, and the holder 16 is placed on top and the lock between said holder and the baseplate 1 is activated by pushing the bolt 25 forwards. This is effected in a load-free manner and therefore substantially without friction, since the baseplate land holder 16 are not yet clamped to one another. Clamping of these parts takes place only thereafter by subjecting the heat transfer plates 2 to an elastic force directed against the holder 16, likewise pneumatically, i.e. in each case by passing compressed gas into the gap between the support surface 6 and the lower side of the heat transfer plate 2 via the pressure medium pipe 12 and raising said heat transfer plate until the opposite stop surfaces 23 abut the stop surfaces 22, and thus the stop between the heat transfer plate 2 and the holder 16 becomes effective and its relative position is determined.

The position of the workpiece 15 relative to the heat transfer surface 3 is then defined, likewise exactly, by the fixing stop formed between the surface of the workpiece 15 and the lower side of the projection 19, as well as the constant thickness of the workpiece 15, and the width of the gap 20 is established. Owing to the independent mobility of the transfer plates 2 and the character of the forces acting on them, the gap 20 is established in each case without mutual influence of the heat transfer plates, although they are all operated together pneumatically.

The vacuum chamber is then evacuated and in each case the gap 20 is filled via the pipe 5 with a fluid heat transfer medium, in particular a gas having good thermal conductivity, such as helium, which produces excellent and uniform thermal contact between the heat transfer plate 2, which in turn is cooled via the channels 14 by passing in a cooling medium, preferably water, and the workpiece 15. The coating can then be carried out by vapour deposition, cathode sputtering or a similar process, while at the same time the workpieces 15 are cooled in each case via the heat transfer plate 2 and the gas-filled gap 20.

After the end of the coating process, the vacuum chamber is flooded. The air is then removed from the gap between the support surface 6 and the lower surface of the heat transfer plate 2 in each case via the pressure medium pipe 12, and said heat transfer plate is thus lowered. The lock effective between the holder 16 and the baseplate 1 is thus released and the bolts 25 are then drawn back out of the recesses 26 in a load-free manner. Because the locks 25 are pushed forwards and drawn back in a load-free and hence virtually friction-free manner, the formation of troublesome particles is virtually completely avoided. Finally, the gas is removed from the gap and the latter is flushed with air. The holder 16 is then raised and the workpieces 15 are removed.

of course, various modifications of the described operation of the device are possible. Thus, the heat transfer medium may also be a liquid. This also applies to the pressure medium, i.e. the heat transfer plate can also be raised hydraulically instead of pneumatically, and to the locking device. Finally, the device may also be used for heating the workpiece instead of for cooling.

LIST OF REFERENCE SYMBOLS

1 Baseplate
2 Heat transfer plate
3 Heat transfer surface
4 O-ring
5 pipe
6 Support surface
7 Support block
8 Skirt
9 Seal
10 Extension
11 Hole
12 Pressure medium pipe
13 Channel
14 Channels
15 Workpiece
16 Holder
17 Vacuum lifter
18 Handle
19 projection
20 Gap
21 Webs
22 Stop surfaces
23 Opposite stop surfaces
24 Pressure lines
25 Bolts
26 Recesses

What is claimed is:

1. A workpiece holding device for a vacuum unit, comprising:
   a baseplate;
   at least one heat transfer plate carried by the baseplate, the heat transfer plate having a heat transfer surface;
   means defining a pipe communicating with the heat transfer surface;
   a sealing element for supporting said workpiece on the heat transfer plate, the sealing element surrounding the heat transfer surface and the communication between the pipe and the heat transfer surface, and forming a gap separating a workpiece supported by the sealing-element from the heat transfer surface for receiving a heat transfer medium;
   a holder displaceable perpendicularly to the heat transfer surface, between a closed position and an open position, the holder having at least one fixing stop pointing toward the heat transfer surface and adapted to press the workpiece onto the sealing element in the closed position;
   a locking device effective in the closed position between the baseplate and the holder to lock the holder in the closed position;
   displacement means for displacing the heat transfer plate relative to the baseplate, perpendicular to the heat transfer surface; and
   stop means effective between the heat transfer plate and the holder in the closed position for determining a relative position between the heat transfer plate and the holder in the closed position.

2. A workpiece holding device according to claim 1, including force means for subjecting the heat transfer plate to a force which is directed toward the holder in the closed position and whose effect is limited by the stop means for adjusting a width of the gap separating a workpiece supported on the sealing element, from the heat transfer surface.

3. A workpiece holding device according to claim 1, wherein a width of the gap separating a workpiece from the heat transfer surface is not greater than 1 mm.

4. A workpiece holding device according to claim 1, wherein a width of the gap separating a workpiece from the heat transfer surface is not greater than 0.3 mm.

5. A workpiece holding device according to claim 2, wherein the force means is one of hydraulic or pneumatic means for applying the force.

6. A workpiece holding device according to claim 5, wherein the force means comprises a support surface of the baseplate for engaging a lower surface of the heat transfer plate so that the heat transfer plate can rest on the baseplate, and a pressure medium pipe opening into the support surface.

7. A workpiece holding device according to claim 6, wherein the support surface forms a top of a support block and is overhung by a downward-pointing skirt of the heat transfer plate which is sealed against a lateral surface of the support block via an all-round seal.

8. A workpiece holding device according to claim 1, wherein the heat transfer plate has at least one lower extension that is mounted for displacement in a hole in the baseplate.

9. A workpiece holding device according to claim 1, wherein the locking device is effective between the baseplate and the holder and is operated hydraulically or pneumatically.

10. A workpiece holding device according to claim 1, wherein the locking device comprises locks which can be pushed forward and drawn back, and are displaceably mounted in the baseplate at least approximately parallel to the heat transfer surface and engage corresponding recesses in the holder.

11. A workpiece holding device according to claim 1, wherein the baseplate and the holder are each formed as a single piece, and the baseplate has a plurality of heat transfer plates that are displaceable independently of one another.

12. A workpiece holding device according to claim 1, including means so that the holder is brought into the closed position and locked to the baseplate by the locking device before beginning of a processing of a workpiece supported on the sealing element, the holder being released and being brought into the open position after the processing of the workpiece, and wherein, during the processing of the workpiece, the heat transfer plate is subjected to the force directed toward the holder, but not during and locking and the release of the holder.

13. A workpiece holding device according to claim 12, including means so that, at the beginning of processing of the workpiece, a gas having a good thermal conductivity is passed as the heat transfer medium into the gap between the heat transfer surface and a lower side of the workpiece.

* * * * *